United States Patent [19]

Goedken et al.

[11] 4,378,534
[45] Mar. 29, 1983

[54] WIDEBAND MODULATION SENSITIVITY COMPENSATED VOLTAGE CONTROLLED OSCILLATOR

[75] Inventors: Terrance J. Goedken, Roselle; James K. Gehrke, Palatine, both of Ill.

[73] Assignee: Motorola, Inc., Schaumburg, Ill.

[21] Appl. No.: 249,532

[22] Filed: Mar. 31, 1981

[51] Int. Cl.³ .................... H03C 3/08; H03C 3/22
[52] U.S. Cl. .................. 332/18; 331/177 V; 332/30 V
[58] Field of Search .............. 332/18, 30 V, 16 R, 332/16 T, 19; 331/36 C, 177 V, 179, 16, 23; 455/113, 199, 262, 254, 256, 258

[56] References Cited

U.S. PATENT DOCUMENTS

| | | | |
|---|---|---|---|
| 3,400,338 | 9/1968 | Ishman | 331/117 R |
| 3,416,100 | 12/1968 | Kruse, Jr. et al. | 331/108 B |
| 3,571,754 | 3/1971 | Healey et al. | 331/177 V X |
| 3,579,281 | 5/1971 | Kam et al. | 332/30 V |
| 3,614,665 | 10/1971 | Weller et al. | 331/101 |
| 3,668,553 | 6/1972 | Dunn et al. | 331/107 G |
| 3,755,758 | 8/1973 | Leeson | 331/101 |
| 3,825,858 | 7/1974 | Amemiya et al. | 331/177 V X |
| 3,959,728 | 5/1976 | Yamazaki et al. | 331/36 C X |
| 4,075,580 | 2/1978 | Sunkler | 331/96 |

FOREIGN PATENT DOCUMENTS

| | | | |
|---|---|---|---|
| 2706662 | 8/1978 | Fed. Rep. of Germany | 332/30 V |
| 55-28677 | 2/1980 | Japan | 332/30 V |

*Primary Examiner*—Siegfried H. Grimm
*Attorney, Agent, or Firm*—James A. Scheer; James W. Gillman

[57] ABSTRACT

A wideband, modulation sensitivity compensated, voltage controlled oscillator which automatically and continuously compensates over a wide bandwidth for modulation sensitivity variations resulting from changes in the center frequency of oscillation. The invention includes a compensation network which continuously varies the coupling between the modulation circuit and the oscillator tank circuit in response to changes in the steering control signal applied to a steering network. Continuous modulation sensitivity compensation is thereby provided over a wide bandwidth.

4 Claims, 3 Drawing Figures

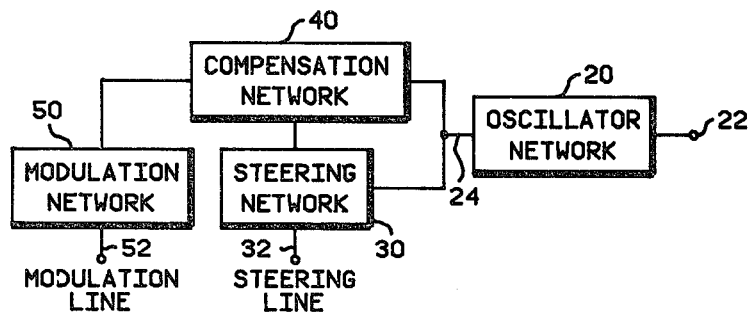
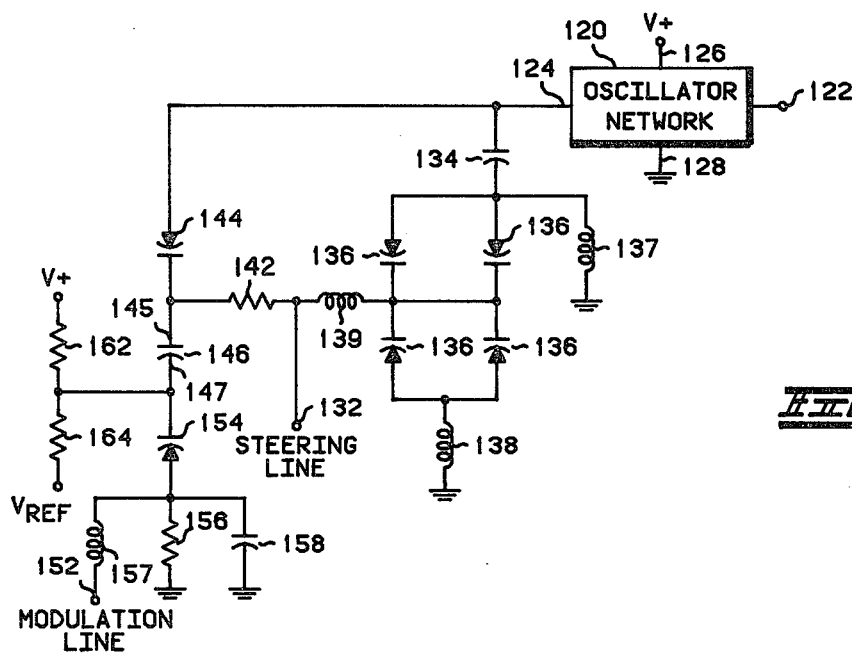
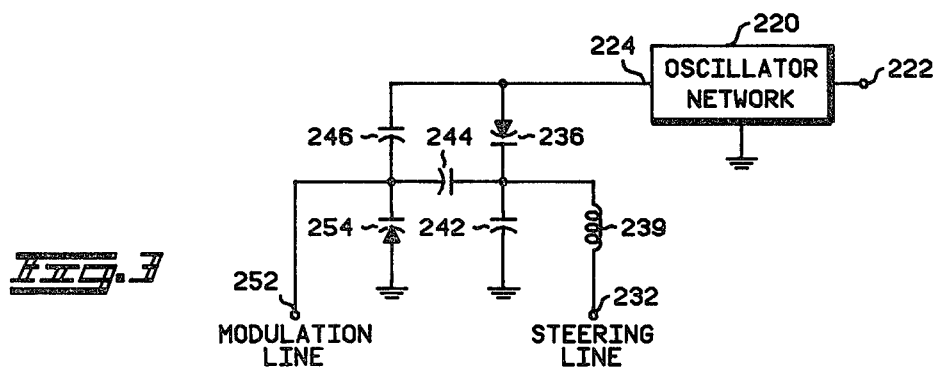

WIDEBAND MODULATION SENSITIVITY COMPENSATED VOLTAGE CONTROLLED OSCILLATOR

BACKGROUND OF THE INVENTION

A. Field of the Invention

This invention relates generally to oscillators and more particularly to a voltage controlled oscillator compensated to minimize modulation sensitivity variations over a wide frequency bandwidth.

B. Description of the Prior Art

It is frequently necessary in the implementation of a phase-locked loop for a frequency synthesizer or receiver local oscillator, and in other applications such as FM generators, data transmitters, and telemetry data links, to provide a voltage controlled oscillator whose output frequency can be controlled over a wide bandwidth. Particularly in implementing a synthesized radio transceiver, a wide bandwidth VCO is desirable to maximize the number of channels of operation. However, past attempts to provide wide bandwidth operation have resulted in variations in modulation sensitivity over the operating frequency range. Until now attempts to solve this problem involved utilizing an audio level switch or potentiometer to compensate for sensitivity changes, which caused discrete sensitivity changes or required adjustment by an operator. This resulted in inaccurate compensation and in unacceptable splatter performance.

SUMMARY OF THE INVENTION

Accordingly, it is an object of the invention to provide an improved voltage controlled oscillator which automatically and continuously compensates modulation sensitivity variations over a wide frequency bandwidth.

It is another object of the invention to provide an improved voltage controlled oscillator having a novel RF compensation network to continuously compensate for changes in modulation sensitivity over a wide bandwidth.

It is yet another object of the invention to provide an improved voltage controlled oscillator suitable for use in a radio transmitter which maximizes splatter performance by maximizing accuracy of modulation sensitivity compensation over a wide frequency bandwidth.

Briefly, according to the invention, a wide band modulation sensitivity compensated voltage controlled oscillator is provided which includes an oscillator circuit which generates a radio frequency signal at an output. A steering circuit is coupled to the oscillator circuit for providing high sensitivity control of the frequency of the output signal of the oscillator circuit in response to a signal applied to a control input of the steering circuit. A modulation circuit provides low sensitivity control of the frequency of the output signal of the oscillator circuit in response to a signal applied to a control input of the modulation circuit. A compensation circuit, coupled to the modulation circuit, the steering circuit, and the oscillator circuit, compensates the sensitivity of the modulation circuit in response to the signal applied to the steering circuit control input. The compensation circuit continuously varies the coupling between the modulation circuit and the oscillator circuit in response to changes in the signal applied to the steering circuit control input thereby providing continuous compensation of sensitivity variations caused by changes in the steering circuit capacitance.

BRIEF DESCRIPTION OF THE DRAWINGS

The features of the present invention which are believed to be novel are set forth with particularity in the appended claims. The invention, together with further objects and advantages thereof, may best be understood by reference to the following description when taken in conjunction with the accompanying drawings.

FIG. 1 is a generalized block diagram illustrating the inventive wideband modulation sensitivity compensated voltage controlled oscillator according to the invention.

FIG. 2 is a schematic diagram of the preferred embodiment wideband modulation sensitivity compensated voltage controlled oscillator according to the invention.

FIG. 3 is a schematic diagram of an alternate embodiment of a wideband modulation sensitivity compensated voltage controlled oscillator according to the invention.

DESCRIPTION OF THE PREFERRED EMBODIMENT

Referring now to FIG. 1, there is shown in block diagram form a wideband modulation sensitivity compensated voltage controlled oscillator (VCO) constructed according to the invention. An oscillator network 20 is shown which may be understood to provide the active elements as well as resonant tank feedback circuitry (not shown) configured in the conventional manner to provide an oscillating signal at an output 22. The oscillator network 20 may be one of many oscillator circuit configurations known in the art. Coupled to the oscillator network input 24 is control circuitry composed of a steering network 30, a compensation network 40, and a modulation network 50, as shown. This control circuitry varies the resonant tank capacitance to control the center frequency of oscillation of the oscillator network 20. The steering network 30 includes a steering line input (control input) 32. The voltage applied to the input 32 controls the impedance of the steering network 30, and thereby controls the frequency of oscillation of the oscillator network 20, forming a voltage controlled oscillator. The steering network 30 is a high sensitivity circuit, typically utilizing varactor diodes, which produces a large change in oscillator frequency for a relatively small voltage change (i.e. in the preferred embodiments about 3 megahertz per volt) thus permitting the oscillator frequency to be varied over a wide bandwidth. The steering network 30 is also coupled to a compensation network 40, as shown. The compensation network 40 provides compensation for sensitivity variations caused by the steering network changes as will be more fully described hereinafter. A modulation network 50 is coupled to the compensation network 40 to provide a low sensitivity means to control the frequency of oscillation of the oscillator network 20. The modulation network 50, changes impedance in response to a voltage applied to a modulation line terminal (control/input) 52. This change is coupled to the oscillator network 20 through the compensation network 40 resulting in a change in the output frequency. In a transmitter system, the signal applied to the modulation line is typically an audio signal intended to modulate the transmitter carrier. Voltage controlled oscillators, until now, suffered from a limitation in that a change in frequency due to a signal on the steering line (e.g. to change to a different channel) caused an unacceptable change in the sensitivity of the modulation network. That is, a given modulation voltage change did not result in the same frequency change at different values of steering line voltage. This problem is solved in the present invention by the compensation circuit 40. As the steering network 30 changes the center frequency of oscillation of the oscillator network 20, the compensation circuit 40 changes the coupling between the modulation network 50 and the oscillation network 20. Thus, when the steering network causes an increase in modulation sensitivity, the compensation network, in response to the steering network, reduces the coupling between the modulation network 50 and the oscillation network 20, so that a substantially constant modulation sensitivity is maintained. A decrease in the modulation sensitivity due to the steering network will be compensated by a similar increase in coupling between the modulation network 50 and the oscillator network 20.

Illustrated in FIG. 2 is a detailed schematic diagram of the preferred embodiment of the wide band modulation sensitivity compensated voltage controlled oscillator according to the invention. A conventional oscillator network 120 is shown having a terminal 128 connected to ground, a supply terminal 26 connected to a voltage source V+, and an output terminal 122. An input terminal 124 is coupled, as shown, through a coupling capacitor 134 to a series parallel arrangement of four varactor diodes 136, configured as shown. Linearizing inductors 137 and 138 are connected as shown, from the anodes of the varactors 136 to ground. This network of varactors 136 substantially comprises the steering network for the circuit. An RF choke 139 is coupled, as shown, from the cathodes of the varactor diodes 136 to the steering line terminal 132, thereby coupling the steering voltage to the cathodes of the varactor diodes 136. The steering line terminal 132 is also coupled through a coupling resistor 142 to the cathode of a compensation varactor diode 144. The anode of the compensation varactor diode 144 is coupled, as shown, to the input 124 of the oscillator network 120 which provides the necessary ground reference. The cathode of the compensation varactor diode 144 is also coupled to a first terminal 145 of a coupling capacitor 146. The second terminal 147 of the coupling capacitor 146 is coupled to the cathode of a modulation varactor diode 154. Thus, the capacitor 146 and the varactor diode 144 form a coupling element which couples the modulation varactor diode 154 to the oscillator network 120. A DC blocking resistor 156 and a RF bypass capacitor 158 are coupled from the anode of the modulation varactor diode 154 to ground, as shown. In addition, an RF choke 157 is coupled from a modulation line terminal 152 to the anode of the modulation varactor 154. Two resistors 162, 164, are coupled, as shown, to the cathode of the modulation varactor 154 to provide bias. The resistor 162 is coupled at one end to the voltage source V+ and at the other end to the resistor 164, which is coupled to a reference voltage level $V_{REF}$, as shown. This arrangement of the resistors 162 and 164 permits bias for the modulation varactor 154 to be set to the desired value by the choice of $V_{REF}$. This value of $V_{REF}$ can be set to any desired value including ground level. The preferred environment for this circuit is in a switched wideband voltage controlled oscillator of a wideband frequency synthesizer more details of which may be obtained by referencing a copending application, Ser. No. 249,535, filed on even date hereof, on behalf of Terrance J. Goedken, James K. Gehrke, Richard A. Rose, and Roger Vilmur and assigned to the same assignee as the present invention.

Referring again to FIG. 2, a steering line voltage applied to the steering line terminal 132 is coupled through the inductor 139 to the cathodes of the varactor diodes 136. An increase in the steering line voltage will therefore result in a decrease in the capacitance of the varactor diodes 136 which will cause the frequency of oscillation of the oscillator network 120 to increase. The decreased capacitance would normally result in an increase of the sensitivity of the oscillator network 120 to changes in the capacitance of the modulation varactor diode 154. Thus, the increase in steering line voltage would normally result in an increase in the frequency change caused by a given change in the modulation line voltage applied to modulation line terminal 152. This is due to the decrease in the total capacitance of the oscillator circuit caused by the decrease in the capacitance of the steering varactor diodes 136. The opposite effect would occur if the steering line voltage were decreased. However, the steering line voltage is also coupled through the resistor 142 to the compensation varactor diode 144. This compensation varactor diode 144 together with the coupling capacitor 146 couple the modulation varactor 154 to the oscillator network 120. An increase in the steering line voltage, coupled to the compensation varactor diode 144 will result in a decrease in the capactance of the compensation varactor diode 144 thus decreasing the coupling of the modulation varactor diode 154 to the oscillator network 120. This decrease in coupling reduces the effect that the capacitance of the modulation varactor 154 has on the oscillator frequency, thereby compensating for the increased sensitivity that would normally be caused by the decrease in the capacitance of the steering varactor diodes 136. A decrease in the steering line voltage will cause an increase in the coupling through the compensation varactor diode 144, thus providing compensation for steering line voltage decrease as well.

An alternative embodiment of the wide band modulation sensitivity compensated voltage controlled oscillator according to the invention is illustrated in FIG. 3. A steering line voltage is applied to a steering line terminal 232 and coupled through an RF choke 239 to the cathode of a steering varactor diode 236. The anode of the steering varactor 236 is coupled, as shown, to the input 224 of a conventional oscillator network 220 which generates an output signal at an output terminal 222. The oscillator 220 also provides the necessary ground reference for the varactor diode 236 at the input 224. Also coupled to the cathode of the steering varactor diode 236 is a capacitor 242 to ground and a capacitor 244, coupled to the cathode of a modulation varactor diode 254, as shown. The cathode of the modulation varactor diode 254 is also coupled through a capacitor 246 to the oscillator network 220, as shown, while the anode of the modulation varactor diode 254 is coupled to ground. Thus, the modulation varactor diode 254 is coupled to the oscillator network 220 through the combination of the capacitor 246, and the capacitor 244 in series with the steering varactor diode 236. A modulation line voltage is coupled from a modulation line terminal 252 to the cathode of the modulation varactor diode 254 to provide modulation of the oscillator output frequency.

An increase in the steering line voltage applied to the steering line terminal 232 will result in a decrease in the capacitance of the steering varactor diode 236. This results in a decrease in the total oscillator capacitance, as well as an increase in the output frequency of the oscillator at the output 222. The decrease in capacitance would normally result in an increase in sensitivity to changes in the capacitance of the modulation varactor diode 254 due to changes in the modulation voltage applied through the modulation line terminal 252. However, since the modulation varactor diode 254 is coupled to the oscillator network 220 through both the capacitor 246 and through the series combination of the capacitor 244 and the steering varactor diode 236, the decrease in capacitance of the steering varactor diode 236 results in a decrease in the coupling from the modulation varactor diode 254 to the oscillator network 220. Thus, the expected increase in modulation sensitivity is offset by the decrease in coupling from the modulation circuit to the oscillator network 220, thereby providing modulation sensitivity compensation. A decrease in steering line voltage will result in an opposite compensating effect.

In summary, an improved wideband voltage controlled oscillator has been described, suitable for use in a wideband radio communication system, which is modulation sensitivity compensated. The circuit described automatically and continuously compensates over a wide bandwidth for modulation sensitivity variations which result when the center frequency of the oscillator is changed.

While a preferred embodiment of the invention has been described and shown, it should be understood that other variations and modifications may be implemented. It is therefore contemplated to cover by the present application any and all modifications and variations that fall within the true spirit and scope of the basic underlying principles disclosed and claimed herein.

What is claimed is:

1. An improved wideband, modulation sensitivity compensated voltage, controlled oscillator, comprising:
   oscillator means, having an input and an output, for providing an RF frequency sinal at the output;
   steering means, having a control input and coupled to the oscillator means, for providing high sensitivity control of the frequency of the output signal of the oscillator means in response to a signal applied to the control input thereof, said steering means comprising a first pair of series connected varactor diodes in parallel with a second pair of series connected varactor diodes, said varactor diodes having a common cathode coupled to the steering means control input, and further comprising linearizing inductors coupled to said steering means varactor diodes and configured such that the anode of each diode is coupled to ground through a linearizing inductor;
   modulation means, having a control input, for providing low sensitivity control of the frequency of the output signal of the oscillator means in response to a signal applied to the control input thereof;
   compensation means, coupled to the modulation means, the steering means, and the oscillator means, for compensating the sensitivity of the modulation means in response to the signal applied to the steering means control input.

2. The improved wideband, modulation sensitivity compensated, voltage controlled oscillator of claim 1 wherein the modulation means includes a varactor diode network, having at least one varactor diode, having one terminal coupled to the control input and responsive to the signal applied to the control input of the modulation means, and including bias modification means, coupled to the second terminal of said varactor diode for controlling the bias of said varactor diode in response to a voltage applied to said bias modification means.

3. The improved wideband, modulation sensitivity compensated, voltage controlled oscillator of claim 2 wherein the compensation means includes at least one varactor diode responsive to the signal applied to the steering means control input in series with at least one capacitor adapted to provide controlled coupling from the modulation means to the oscillator means thereby compensating for changes in the capacitance of the steering means.

4. The improved wideband, modulation sensitivity compensated, voltage controlled oscillator of claims 1 or 2 wherein the compensation means includes a fixed capacitor network coupled to the steering means which provides controlled capacitive coupling between the oscillator means and the modulation means in response to changes in the capacitance of the steering means.

* * * * *